United States Patent [19]

Preschutti

[11] Patent Number: 4,755,776
[45] Date of Patent: Jul. 5, 1988

[54] TAP DEVICE FOR BROADBAND COMMUNICATIONS SYSTEMS

[75] Inventor: Joseph P. Preschutti, State College, Pa.

[73] Assignee: Broadband Networks, Inc., State College, Pa.

[21] Appl. No.: 22,438

[22] Filed: Mar. 6, 1987

[51] Int. Cl.[4] .......................... H03H 7/46; H03H 7/48
[52] U.S. Cl. ..................................... 333/100; 333/109; 333/117; 333/132; 333/81 R
[58] Field of Search ............... 333/100, 109, 119, 129, 333/131, 132, 134, 136, 117, 81 R; 455/3, 5, 6; 361/413

[56] References Cited

U.S. PATENT DOCUMENTS

| | | |
|---|---|---|
| 3,176,230 | 3/1965 | Collins . |
| 3,416,102 | 12/1968 | Hamlin . |
| 3,486,135 | 12/1969 | Sweeney . |
| 3,537,036 | 10/1970 | Winegard et al. . |
| 3,671,885 | 6/1972 | Pennypacker . |
| 3,832,603 | 8/1974 | Cray et al. ........................ 361/413 |
| 3,881,160 | 4/1975 | Ross . |
| 3,895,318 | 7/1975 | Ross . |
| 3,983,486 | 9/1976 | Rheinfelder . |
| 4,378,537 | 3/1983 | Scandurra . |
| 4,481,641 | 11/1984 | Gable et al. . |
| 4,484,218 | 11/1984 | Boland et al. . |
| 4,514,757 | 4/1985 | Noji et al. . |
| 4,577,221 | 3/1986 | Skinner, Sr. et al. . |
| 4,578,702 | 3/1986 | Campbell, III . |
| 4,646,295 | 2/1987 | Basile ................................ 455/3 X |

Primary Examiner—Paul Gensler
Attorney, Agent, or Firm—Stanley J. Price, Jr.

[57] ABSTRACT

A tap device for use in broadband communications systems includes a circuit board mounted on a cover plate assembly which is removably connected to a base housing. The circuit board includes an RF signal coupling element and an RF signal splitting element. The output of the RF signal coupling element and the input to the RF signal splitting element are each connected to a separate female receptacle positioned on the circuit board. The female receptacles are designed to receive an intermediate circuit which, when inserted into the female receptacles, is electrically connected between the RF signal coupling element output and the RF signal splitting element input. The intermediate circuit may consist of a short circuit feedthrough, or a plug-in fixed or variable degree attenuator. The intermediate circuit may also include a duplex filter and plug-in attenuator arrangement for attenuating higher frequency RF signals provided from a source which pass through the tap device to a load connected to the tap device outlet independently of lower frequency RF signals provided from a load which pass through the tap device for delivery to the source.

24 Claims, 2 Drawing Sheets

TAP DEVICE FOR BROADBAND COMMUNICATIONS SYSTEMS

BACKGROUND OF THE INVENTION

1. Field of the Invention

This invention relates to a tap device, and more particularly, to a tap device for use in broadband communications systems having a receptacle area electrically positioned between and connected to an RF signal coupling element and an RF signal splitting element for receiving a plug-in intermediate circuit having a preselected electrical configuration to provide a tap device capable of being utilized in a variety of applications.

2. Description of the Prior Art

It is well-known in the communications industry to provide a tap device for attenuating RF signals provided from a source for delivery to a plurality of loads or subscribers connected to the tap device outlet. Tap devices normally provide a fixed degree of attenuation of a source RF signal so that the load or subscriber connected to the tap device outlet can use the attenuated RF signal for any particular application. The degree of attenuation of the RF signal passing through the tap device is dependent upon the hardwired tap device electrical circuitry. Tap devices normally include a base housing having means for securing a coaxial cable connected to the tap device. The tap device also includes a cover plate having an inner surface upon which is mounted the tap device electrical circuitry for providing a preselected degree of attenuation of the RF signal delivered from the source, and a plurality of outlet taps mounted on the cover plate outer surface for connection to a plurality of loads or subscribers.

Although tap devices for broadband communication systems are known, a problem inherent with the prior art tap devices is that, since the electrical attenuation circuitry consists of fixed electrical components which are hardwired on the tap device cover plate, if it is desired to change the attenuation value of the tap device, the cover plate must be removed and a new cover plate installed which includes circuitry having a different preselected attenuation value.

U.S. Pat. No. 3,881,160 discloses a multi-tap distribution box for a CATV system, the box being interposed in a primary line carrying radio and video signals from a master station to subscribers who are linked to the primary line by secondary lines coupled to the taps on the box. The box consists of an open housing having input and output parts interconnected through a normally closed switch whereby signals pass through the housing. Removably secured to the housing is a tap cover plate having a distribution network mounted on its inner face, the network being connected to a group of taps projecting from the outer face. The plate further includes means to engage and break open the switch whereby the distribution network is rendered inoperative to supply the signals to the taps.

U.S. Pat. No. 3,895,318 discloses a multi-tap distribution box for a cable television system, the box being interposed in a distribution line carrying audio, video, or other electrical signals or data as well as power to and from subscribers who are interconnected to the distribution line by means of secondary lines coupled to taps on the distribution box. The box consists of a housing having input and output ports, and a tap cover plate having a distribution network mounted on its inner face. The network is connected to a group of taps projecting from the outer face, means being provided to connect the network to the input and output ports when the tap plate is in place and to disconnect the network from the ports when the tap cover plate is removed from the housing.

Although the prior art tap devices described herein all provide means for attenuating an RF signal provided from a source and means for delivering the attenuated RF signal to a plurality of subscribers, these prior art devices are limited in that they are composed of electrical components which are hardwired to the tap box cover plate assembly. As a result, if it is desired to change the attenuation value of the tap device for any reason, the tap cover plate must be removed and a new cover plate installed having the proper electrical circuitry to provide the desired degree of attenuation.

As seen, maintaining an adequate inventory of tap cover plates each having a different preselected attenuation value is a major logistics concern for both the user and the supplier of the tap units. Tap cover plates must be maintained in inventory not only for each preselected degree of attenuation desired, but also for each preselected number of output taps required. For example, it may be desired to maintain a tap cover plate inventory for use in single-cable split-band broadband communications systems to accommodate known-in-the-art subfrequency split, mid frequency split and high frequency split filtering and attenuation circuitry. It also may be desired to maintain a tap cover plate inventory for dual cable systems in which the tap cover plates have attenuation values in 1 decibel increments ranging from 4 to 40 decibels. If individual hardwired tap cover plates were to be maintained in inventory to cover all possible single-cable split-band sub, mid and high frequency configurations and all possible dual dable attenuation configuration, the total number of individual hardwired tap cover plates required to be maintained in inventory would number in the thousands.

Therefore, there is a need for an improved tap device which includes the basic tap device circuitry mounted on a tap cover plate and also includes receptacle means electrically positioned on the cover plate between the tap device RF signal coupling element and the tap device signal splitting element. A portion of the receptacle means is electrically connected to the RF signal coupling element and a portion of the receptacle means is connected to the RF signal splitting element. The receptacle means is designed to accept a plug-in intermediate circuit which, when inserted into the receptacle means, provides an electrical connection between the RF signal coupling element and the RF signal splitting element. The plug-in intermediate circuit may either be a short circuit feedthrough, in which case, the tap device can operate as a standard CATV tap unit, or an attenuator which can be plugged into the receptacle means to provide a further, finer degree of attenuation of the RF signal passed through the RF signal coupling element. The intermediate circuit may also include a combination of duplex filters and plug-in attenuators to convert the tap device from a standard CATV tap device to a tap device usable for single-cable split-band communications systems.

SUMMARY OF THE INVENTION

In accordance with the present invention, there is provided a tap device for broadband communication systems which includes an RF signal coupling circuit portion positioned on a circuit board. The RF signal coupling circuit portion has an input for receiving an RF signal supplied from a source. The RF signal is attenuated a first preselected degree by the RF signal coupling circuit portion. An RF signal splitting circuit portion is also positioned on the circuit board and has an input and a plurality of output ports. The circuit board includes a plurality of receptacles, the RF signal coupling circuit portion output being electrically connected to one of the receptacles and the RF signal splitting circuit portion input being electrically connected to another of the receptacles. An intermediate circuit portion is removably connected between the RF signal coupling circuit portion output receptacle and the RF signal splitting circuit portion input receptacle to electrically connect the intermediate circuit portion between the RF signal coupling circuit portion output and the RF signal splitting circuit portion input. The intermediate circuit portion further attenuates the RF signal coupling circuit portion attenuated RF output signal by a second preselected degree to control the total degree of attenuation of the RF signal supplied from the source to the RF signal splitting circuit portion.

Further in accordance with the present invention, there is provided a tap device for split-band single-cable communications systems which includes an RF signal coupling circuit portion positioned on a circuit board. The RF signal coupling circuit portion has an input terminal and an output terminal. Also positioned on the circuit board is an RF signal splitting circuit portion which has an input terminal and a plurality of output ports. The circuit board includes a plurality of receptacles. The RF signal coupling circuit portion output terminal is electrically connected to one of the receptacles and the RF signal splitting circuit portion input terminal is electrically connected to another of the receptacles. An intermediate circuit portion is removably connected between the RF signal coupling circuit portion output termianl receptacle and the RF signal splitting circuit portion input terminal receptacle to electrically connect the intermediate circuit portion between the RF signal coupling circuit portion and the RF signal splitting circuit portion. The intermediate circuit portion includes filtering means for separating RF signals passing from the RF signal coupling circuit portion to the RF signal splitting circuit portion from RF signals passing from the RF signal splitting circuit portion to the RF signal coupling circuit portion. The intermediate circuit portion also includes receptacles for receiving plug-in attenuators. The receptacles positioned in the intermediate circuit portion electrically connect the attenuators with the filtering means to provide attenuation of RF signals passing from the RF signal coupling circuit portion to the RF signal splitting circuit portion independently of RF signals passing from the RF signal splitting circuit portion to the RF signal coupling circuit portion.

Additionally in accordance with the present invention, there is provided a method for making a tap device for use in broadband communications systems which includes the steps of providing a circuit board including an RF signal coupling circuit portion and an RF signal splitting circuit portion. The method further includes the steps of providing the circuit board with a plurality of individual electroconductive receptacles, and connecting an output terminal of the RF signal coupling circuit portion to one of the receptacles and another of the receptacles. An intermediate circuit portion is removably connected between the RF signal coupling circuit portion output terminal receptacle and the RF signal splitting circuit portion input terminal receptacle to electrically connect the RF signal coupling circuit portion with the RF signal splitting circuit portion to provide a preselected degree of attenuation of an RF signal provided from the RF signal coupling circuit portion to the RF signal splitting circuit portion.

Accordingly, the principle object of the present invention is to provide a tap device which includes an RF signal coupling circuit portion and an RF signal splitting circuit portion wherein a plurality of receptacles are electrically positioned between the tap device RF signal coupling circuit portion and the RF signal splitting circuit portion for receiving an intermediate circuit portion.

Another object of the present invention is to provide a tap device having receptacle means for receiving an intermediate circuit portion between the tap device RF signal coupling circuit portion output and the tap device RF signal splitting circuit portion input to provide a preselected degree of attenuation of RF signals passing through the tap device.

An additional object of the present invention is to provide a tap device having receptacle means for receiving an intermediate circuit portion which includes filtering means and plug-in attenuating means for attenuating RF signals passing through the tap device from a source to a load independently of RF signals passing from a load through the tap device to a source.

These and other objects of the present invention will be more completely disclosed and described in the following specification, the accompanying drawings and the appended claims.

DESCRIPTION OF THE PREFERRED EMBODIMENTS

Figure 1:
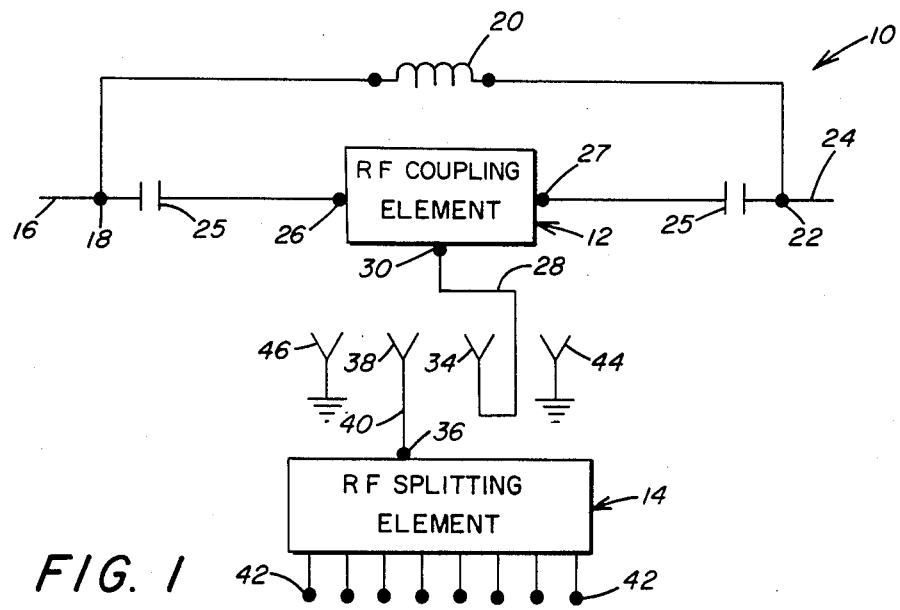
FIG. 1 is a schematic illustration of a standard tap device for use in broadband communications systems which includes receptacles electrically positioned between a tap device RF signal coupling element and an RF signal splitting element.

Referring to the drawings and particularly to FIG. 1, there is schematically illustrated a tap device for use in broadband communications systems generally designated by the numeral 10. Tap device 10 includes an RF signal coupling element schematically illustrated by the numeral 12 and an RF signal splitting element schematically illustrated by the numeral 14. Both RF signal coupling element 12 and RF signal splitting element 14 are known in the art and are illustrated and described herein only as they pertain to the present invention.

As seen in FIG. 1, tap device 10 has an input schematically illustrated by the numeral 16. Input 16 is a coaxial cable which carries an RF signal supplied from a source (not shown) and A.C. power to tap device 10. Tap device 10 includes an RF signal coupling element 12.

RF signal coupling element 12 is a three-terminal device, and as shown in FIG. 1, includes input terminal 26, and output terminals 27 and 30. As known in the art, RF signal coupling element 12 may either be an equal power splitter, a directional coupler, or an end of the line direct coupler.

An RF signal present on coaxial cable 16 passes through capacitor 25 positioned between terminal 18 and RF signal coupling element 12 and enters RF signal coupling element 12 at terminal 26. Depending upon the electrical configuration of RF signal coupling element 12 (equal power splitter, directional coupler, or end of the line direct coupler), the RF signal entering RF signal coupling element 12 at terminal 26 is proportioned within RF signal coupling element 12 to provide that a portion of the RF signal passes through RF signal coupling element 12 output terminal 30 and a portion of the RF signal passes through RF signal coupling element 12 output terminal 27. The portion of the RF signal which passes through output terminal 27 is passed through capacitor 25 between output terminal 27 and terminal 22 and into a coaxial cable schematically illustrated by the numeral 24. This RF signal continues downstream on coaxial cable 24 to supply any additional tap devices connected to coaxial cable 24.

The pair of capacitors 25 effectively block any A.C. power transmission signals present on coaxial cables 16 and 24 from entering RF signal coupling element 12. Inductor 20, which is connected in parallel to RF signal coupling element 12, passes any A.C. power transmission signals present on coaxial cable 16 to active devices located downstream from tap device 10 and blocks RF signals present on coaxial cable 16. In this manner, RF signals present on coaxial cable 16 must pass through RF signal coupling element 12. The particular electrical arrangement of inductor 20 and capacitors 25 as illustrated is also well known in the art.

As previously described, depending upon the electrical configuration of RF signal coupling element 12, a portion of the RF signal provided to RF signal coupling element 12 at input terminal 26 is passed through RF signal coupling element 12 to output terminal 27. That portion of the RF signal which enters RF signal coupling element 12 input terminal 26 and is passed through RF signal coupling element 12 to output terminal 30 is attenuated by a preselected degree depending upon the configuration of the electrical circuitry within RF signal coupling element 12 and electrical component values. As described, the percentage or portion of the RF signal which passes from coaxial cable 16 to coaxial cable 24 and the portion of the RF signal which passes from coaxial cable 16 to output terminal 30 are dependent upon the electrical component values and the particular arrangement of the electrical circuitry within RF signal coupling element 12.

The RF signal which is attenuated a preselected degree within RF signal coupling element 12 passes through output terminal 30 and output conductor 28 to a female receptacle schematically illustrated by the numeral 34.

As seen in FIG. 1, tap device 10 are includes RF signal splitting element 14. Signal splitting element 14 includes an input terminal 36 electrically connected to a female receptacle schematically illustrated by the numeral 38 by a conductor 40. As previously described, RF signal splitting element 14 is known in the art and includes electrical circuitry designed to split an RF signal provided to RF signal splitting element 14 into a plurality of outputs 42. Although RF signal splitting element 14 illustrates 8 outputs 42, an RF signal splitting element such as RF signal splitting element 14 may normally include either 2, 4 or 8 individual outputs 42.

As described, an RF signal provided from a source to RF signal coupling element 12 is attenuated within RF signal coupling element 12 by a preselected degree depending upon the RF signal coupling element 12 attenuation value and is provided to female receptacle 34. Similarly, the input terminal 36 to RF signal splitting element 14 is electrically connected to female receptacle 38.

Tap device 10 also includes a pair of female receptacles 44 and 46. Both female receptacles 44 and 46 are connected to ground. As will be explained later in greater detail, female receptacles 44 and 46 complete the ground connection for various electrical components inserted into female receptacles 34, 38, 44 and 46.

Since RF signal coupling element 12 output terminal 30 and RF signal splitting element 14 input terminal 36 are electrically connected to female receptacles 34 and 38 respectively, a wide variety of electrical components which make up an intermediate circuit (not shown) may be inserted or plugged into female receptacles 34 and 38 to form an electrical connection between RF signal coupling element 12 output terminal 30 and RF signal splitting element 14 input terminal 36.

For example, if it is desired to operate tap device 10 as a standard CATV tap device, a simple electrical jumper may be inserted between female receptacles 34 and 38 to provide short circuit feedthrough between RF signal coupling element 12, output terminal 30 and RF signal splitting element 14 input terminal 36. In this manner, an RF signal entering tap device 10 on coaxial cable 16 and attenuated within RF signal coupling element 12 is provided directly to RF signal splitting element 14. The attenuated RF signal is split within RF signal splitting element 14 to provide an attenuated RF signal to the plurality of outputs 42.

If it is desired to provide further attenuation of the attenuated RF signal provided by RF signal coupling element 12, an attenuator (not shown) may be provided having a plug-in area designed to be inserted or plugged into receptacles 34, 38, 44 and 46. Standard Pi or Tec type attenuators known in the art having plug-in male stab-type terminations may be inserted into female receptacles 34, 38, 44 and 46 to electrically connect the Pi or Tec type attenuator between RF signal coupling element 12 output terminal 30 and RF signal splitting element 14 input terminal 36.

As known in the art, standard CATV tap devices provide attenuation of RF signals which pass through the tap device in a range of between 4 and 40 decibels in increments of between 3.0 and 3.5 decibels. As seen in FIG. 1, by providing a tap device 10 capable of receiving a plug-in attenuator in female receptacles 34, 38, 44 and 46, a further, finer degree of attenuation of the attenuated RF signal provided by RF signal coupling element 12 may be obtained. Specifically, since attenuators are available which provide attenuation in 1.0 decibel increments, plug-in attenuators may be utilized having increments of attenuation to any degree desired. Plug-in type Pi or Tee attenuators having a degree of attenuation within a range of between 0 decibels and 10 decibels may be inserted or plugged into female receptacles 34, 38, 44 and 46 to further attenuate the RF signal provided by RF signal coupling element 12 within a range of between 0 and 10 decibels in 1.0 decibel increments.

Figure 2:
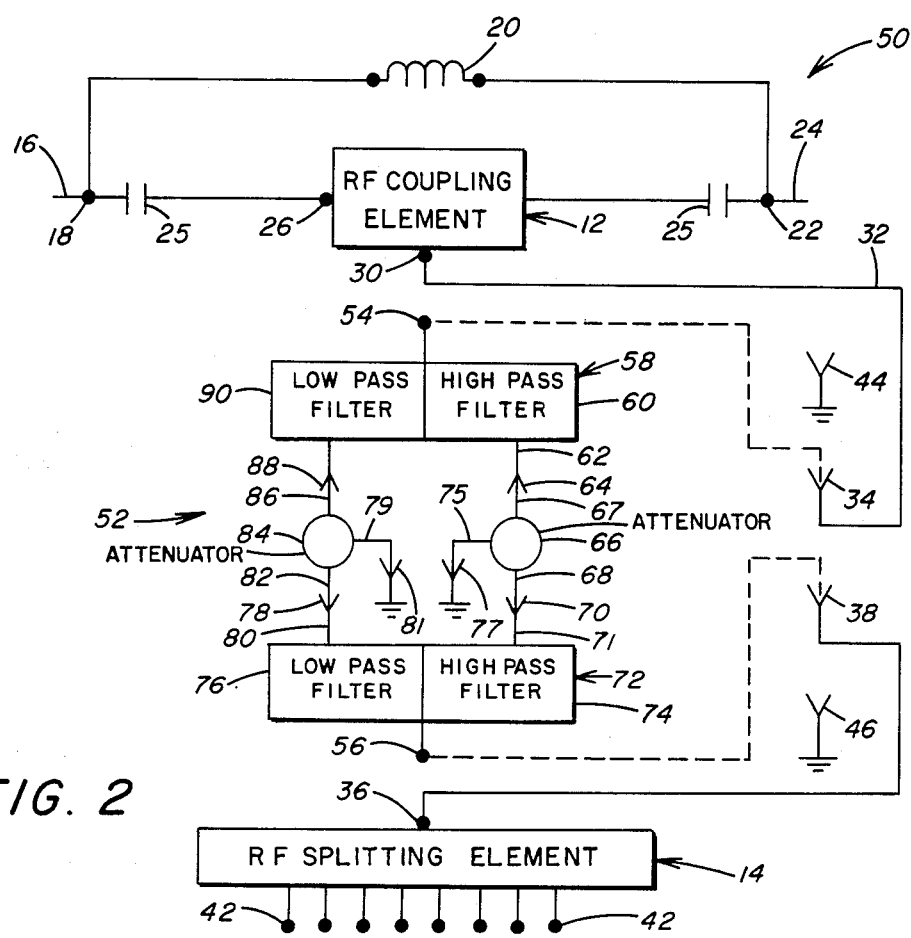
FIG. 2 is a schematic illustration of a tap device for use in split-band single-cable communications systems illustrating an intermediate circuit electrically connected between an RF signal coupling element and an RF signal splitting element by means of a plurality of receptacles.

Referring to FIG. 2, there is schematically illustrated a tap device for use in split-band single-cable communications systems generally designated by the numeral 50. Split-band single-cable tap device circuitry such as the circuitry schematically illustrated in FIG. 2 is also known in the art and is described herein only as it pertains to the present invention.

As seen in FIG. 2, split-band single-cable tap device 50 includes the RF signal coupling element 12 and RF signal splitting element 14 previously described. Further, tap device 50 also includes the female receptacles 34, 38, 44 and 46 illustrated and described in FIG. 1. A comparison of FIGS. 1 and 2 make it clear that the only difference between tap device 10 illustrated in FIG. 1 and the tap device 50 illustrated in FIG. 2 is that tap device 50 includes an intermediate circuit schematically illustrated and generally designated by the numeral 52.

Intermediate circuit 52 includes an input terminal 54 and an output terminal 56. As seen, when input terminal 54 and output terminal 56 are connected to female receptacles 34 and 38, respectively, intermediate circuit 52 is electrically connected between tap device 50 RF signal coupling element 12 and RF signal splitting element 14.

As described, tap device 10 schematically illustrated in FIG. 1 and tap device 50 schematically illustrated in FIG. 2 are identical with the exception of the intermediate circuit 52 connected between female receptacles 34 and 38. In the tap device illustrated in FIG. 1, either a jumper or attenuator is inserted between female receptacles 34 and 38 to provide desired short circuit feed-through or attenuation of the RF signal attenuated by RF signal coupling element 12 and provided to RF signal splitting element 14. In the tap device illustrated in FIG. 2, intermediate circuit 52 is connected between female receptacles 34 and 38 to electrially connect intermediate circuit 52 between RF signal coupling element 12 and RF detail, RF signal coupling As will be explained later in greater detail, RF signal coupling element 12, RF signal splitting element 14 and female receptacles 34, 38, 44 and 46 are suitably positioned on a circuit board adapted to accept a preselected intermediate circuit in female receptacles 34, 38, 44 and 46 to provide a desired tap device configuration.

As known in the art, an intermediate circuit such as intermediate circuit 52 provides a means for varying the attenuation values of RF signals entering tap device 50 on coaxial cable 16 independently of RF signals entering tap device 50 on any one of the plurality of outputs 42. This feature is useful when it is desired to provide a system requiring simultaneous transmission of an RF signal from a source (not shown) to a load connected to any one of the outputs 42 and reception by a source of an RF signal provided by a load connected to any of the output terminals 42.

Tap device 50 is used in split-band single-cable broadband communications systems wherein a substantial portion of the available frequency spectrum is utilized for simultaneous RF signal transmission from a source through tap device 50 to a load connected to output terminals 42 and transmission of an RF signal from the plurality of output terminals 42 through tap device 50 to the source.

As known in the art of split-band single-cable communications systems, RF signals provided from a source and passed from coaxial cable 16 through tap device 50 to outputs 42 are normally contained in the higher frequency spectrum range. These higher frequency RF signals provided from the source enter tap device 50 on coaxial cable 16 and pass through RF signal coupling element 12. As previously described, these higher frequency RF signals are attenuated a preselected degree by RF signal coupling element 12 depending on the electrical configuration and component values of RF signal coupling element 12. The attenuated RF signal passes through conductor 32 to female receptacle 34. These higher frequency RF signals enter intermediate circuit 52 on terminal 54 which is also electrically connected to female receptacle 34. These RF signals, being higher frequency signals, pass through high-pass section 60 of duplex filter 58.

The RF signal present in high-pass section 60 passes through conductor 62 which is electrically connected to a female receptacle 64. An attenuator 66 is also electrically connected to female receptacle 64 by conductor 67 to provide that the RF signal which is passed through high pass section 60 enters attenuator 66. Attenuator 66 may be a plug-in fixed attenuation value attenuator or any variable attenuator as known in the art. Attenuator 66 provides a second, preselected degree of attenuation of the higher frequency RF signal.

The attenuated RF signal passes through conductor 68 which is electrically connected to female receptacle 70. The attenuated RF signal enters duplex filter 72 high pass section 74 through conductor 71 and passes through high pass section 74 through output terminal 56 which is electrically connected to female receptacle 38. The attenuated RF signal enters RF signal splitting element 14 input terminal 36 for delivery to the plurality of outputs 42.

As described, an RF signal supplied by a source (not shown) which enters tap device 50 is first passed through RF signal coupling element 12 and is attenuated a first preselected degree therein. The attenuated RF signal is then passed through high-pass section 60 of duplex filter 58. The higher frequency attenuated RF signal is next passed through attenuator 66 to provide a further, second preselected degree of attenuation of the previously attenuated RF signal. The RF signal is passed through high-pass section 74 of duplex filter 72 for delivery to RF signal splitting element 14.

RF signals which are transmitted from a load (not shown) connected to one of the output terminals 42 through tap device 50 for delivery to a source connected to coaxial cable 16 first enter tap device 50 on one of the output terminals 42. The RF signal first passes through RF signal splitting element 14, and then passes through input terminal 36 and female receptacle 38 to enter intermediate circuit 52 at output terminal 56.

Since RF signals provided from the load are normally lower frequency spectrum signals, these lower frequency RF signals enter duplex filter 72 and pass through low pass section 76. The RF signal passed through low pass section 76 is provided to a female receptacle 78 through conductor 80.

An attenuator 84 receives the lower frequency RF signal from female receptacle 78 through conductor 82. The RF signal passes through attenuator 84 and is attenuated a preselected degree based on the attenuation value of attenuator 84.

The attenuated, lower frequency RF signal passes through conductor 86 which is electrically connected to female receptacle 88 and enters low pass section 90 of duplex filter 58. The attenuated RF signal passes through terminal 54 connected to female receptacle 34 and then passes through conductor 32 and into RF signal coupling element 12 for delivery to the source.

As described, higher frequency RF signals passing from a source to a load through tap device 50 are attenuated independently from RF signals passing from a load through tap device 50 to a source. Since attenuators 66 and 84 are plug-in type attenuators known in the art, the higher frequency RF signal passing from high pass section 60 to high pass section 74 can be attenuated by a degree independent of the lower frequency RF signals passing from low pass section 76 to low pass section 90. Additionally, since the RF signals passing from a source through tap device 50 to a load connected to output terminals 42 are higher frequency signals and the RF signals passing from a load through tap device 50 to a source are lower frequency signals, these higher and lower frequency signals may share all the same electrical circuitry and coaxial cabling in tap device 50 with the exception of intermediate circuit 52.

As described, intermediate circuit 52 connected between RF signal coupling element 12 and RF signal splitting element 14 provides independent attenuation of higher and lower frequency RF signals. Further, attenuators such as attenuators 66 and 84 may be connected between duplex filters 58 and 72 to provide an independent, preselected degree of attenuation for the higher and lower frequency RF signals.

Figure 3:
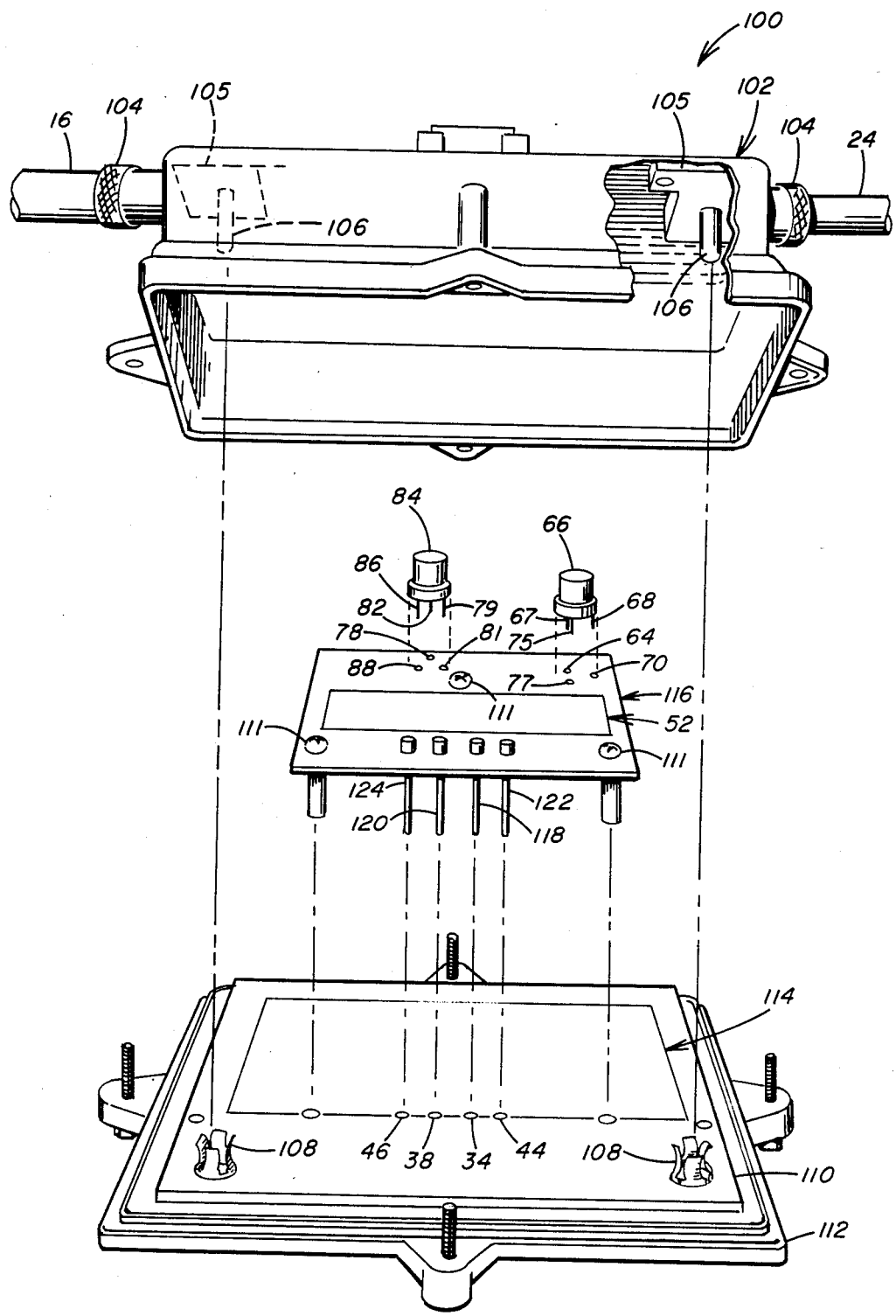
FIG. 3 is an exploded view of a tap base assembly and a tap cover assembly illustrating the various receptacles which are the subject of this invention.

Referring to FIG. 3, there is illustrated a tap device 100 previously schematically illustrated in FIGS. 1 and 2. As previously described the various components which comprise tap device 100 are known in the art. However, the unique configuration of the components and the component interchangeability makes tap device 100 functional for many various tap applications.

Tap device 100 includes a tap base assembly 102 which may be secured to any suitable mounting surface. A pair of cable connectors 104 are threadedly secured to tap base assembly 102 and seize the outer jacket of coaxial cables 16 and 24, respectively. Any of a variety of standard, commercially obtainable cable connectors 104 may be threadedly secured to tap base assembly 102 to seize the outer jackets of coaxial cables 16 and 24. The outer insulation jackets of coaxial cables 16 and 24 are removed from coaxial cables 16 and 24, respectively, and the exposed RF signal carrying conductors are secured within RF conductor seizure means 105. The pair of RF conductor seizure means 105 are electrically connected to a pair of electroconductive protrusions 106. The pair of electroconductive protrusions 106 are arranged to engage a pair of electroconductive receptacles 108 positioned on circuit board 110 which is mounted to tap device 100 cover plate assembly 112. As seen, when cover plate assembly 112 is secured to tap box assembly 102, electroconductive protrusions 106 engage receptacles 108 to provide an RF signal present on coaxial cable 16 to circuit board 110.

Circuit board 110, which is mounted to cover plate assembly 112, includes a circuit portion schematically illustrated as 114. Although not specifically illustrated in FIG. 3, circuit portion 114 includes RF signal coupling element 12 and RF signal splitting element 14 previously schematically illustrated in FIGS. 1 and 2.

The printed circuit board 110 includes all of the electrical circuitry illustrated in FIGS. 1 and 2 including the female receptacles 34, 38, 44 and 46. Although not specifically shown, it should be understood that female receptacle 34 is electrically connected to output terminal 30 of RF to signal coupling element 12, and female receptacle 38 is electrically connected to input terminal 36 of RF signal splitting element 14, as schematically illustrated in FIGS. 1 and 2. Terminals 44 and 46 are each connected to ground.

As previously described, if it is desired to provide a standard CATV tap unit, an electrical jumper is inserted between female receptacles 34 and 38 on circuit board 110 to provide a short circuit feedthrough connection between output terminal 30 of RF signal coupling element 12 and input terminal 36 of RF signal splitting element 14.

If it is desired to provide a further degree of attenuation of the previously attenuated RF signal passing through RF signal coupling element 12, a plug-in attenuator having either a fixed attenuation value or a variable attenuation value may be plugged into receptacles 34, 38, 44 and 46 to provide a further, finer degree of attenuation of the RF output signal of RF signal coupling element 12. As previously described, known Pi or Tee attenuators may be provided which include male-type stabs which may be inserted into the proper female receptacles. For example, a Tee type attenuator, which is a resistance network having three terminals, may be plugged into female receptacles 34, 38 and 44 to electrically connect the Tee type attenuator between RF signal coupling element 12 and RF signal splitting element 14 schematically illustrated in FIG. 1. A Pi type attenuator, consisting of a resistance network having four terminals, may be provided with four male-type stabs and plugged into female receptacles 34, 38, 44 and 46 to connect the Pi type attenuator between RF signal coupling element 12 and RF signal splitting element 14 schematically illustrated in FIG. 1.

As described, the standard tap device circuitry 114 known in the art is mounted on circuit board 110 to operate in conjunction with female receptacles 34, 38, 44 and 46 to provide desired flexibility to form various tap circuit configurations by inserting components into female receptacles 34, 38, 44 and 46.

If it is desired to provide a split-band single-cable tap device, circuit board 116 may be utilized in conjunction with circuit board 110. Circuit board 116 is positioned above and removably secured to circuit board 110 by means of mounting screws 111 so that, when circuit board 116 is secured to circuit board 110, stabs 118-124 engage female receptacles 34, 38, 44 and 46. Circuit board 116 includes the intermediate circuit portion 52 schematically illustrated in FIG. 2. Stab 118 corresponds to intermediate circuit 52 input terminal 54, and stab 120 corresponds to intermediate circuit 52 output terminal 56. As described, when circuit board 116 is mounted on circuit board 110, intermediate circuit portion 52 is electrically connected between RF signal coupling element 12 and RF signal splitting element 14 illustrated in FIG. 2 by means of stabs 118-124.

The attenuators 66 and 84 schematically illustrated in FIG. 2 are illustrated in FIG. 3 and adapted to be plugged into female receptacles 64, 70, 77 and female receptacles 78, 81, 88 respectively on circuit board 116. The attenuators 66 and 84 illustrated in FIG. 3 are three-terminal tee type attenuators having stabs 75 and 79 adapted to be plugged into ground connection receptacles 77 and 81 respectively. It should be understood that if attenuators 66 and 84 are four terminal pi type attenuators, an additional ground connection terminal (not shown) must be added to circuit board 116 to receive an additional ground stab for each of the attenuators 66 and 84. As seen, attenuators 66 and 84 having any preselected degree of attenuation may be plugged into intermediate circuit 52 as schematically illustrated in FIG. 2 to provide an independent degree of attenuation of higher frequency RF signals passing through attenuator 66 from lower frequency RF signals passing through attenuator 84.

As seen in FIG. 3, tap device 100 provides valued versatility in that a standard CATV tap unit may be utilized for many various applications depending upon the components plugged into the female receptacles 34, 38, 44 and 46 mounted on circuit board 110. A standard CATV tap device such as schematically illustrated in FIGS. 1 and 2 may be adapted to provide a number of specialized and novel tap configurations for specific applications by selecting the proper component or combination of components to be inserted into female receptacles 34, 38, 44 and 46.

According to the provisions of the patent statutes, I have explained the principle, preferred construction and mode of operation of my invention and have illustrated and described what I now consider to represent its best embodiments. However, it should be understood that, within the scope of the appended claims, the invention may be practiced otherwise than as specifically illustrated and described herein.

I claim:

1. A tap device for broadband communications systems comprising, an RF signal coupling circuit portion positioned on a circuit board, said RF signal coupling circuit portion having an input for receiving an RF signal supplied from a source, said RF signal coupling circuit portion attenuating a portion of said RF signal supplied from said source by a first preselected degree, said RF signal coupling circuit portion having a first output for providing an attenuated RF output signal and a second output for passing the remaining portion of said RF signal supplied from said source through said RF signal coupling circuit portion, an RF signal splitting circuit portion positioned on said circuit board, said RF signal splitting circuit portion having an input and a plurality of outputs, said circuit board including a plurality of receptacles, said RF signal coupling circuit portion first output being electrically connected to one of said receptacles and said RF signal splitting circuit portion input being electrically connected to another of said receptacles, and an intermediate circuit portion removably connected between said attenuated RF signal coupling circuit portion first output receptacle and said RF signal splitting circuit portion input receptacle to electrically connect said intermediate circuit portion between said RF signal coupling circuit portion first output and said RF signal splitting circuit portion input, said intermediate circuit portion attenuating said RF signal coupling circuit portion attenuated RF output signal by a second preselected degree to control the total degree of attenuation of an RF signal supplied from said source to said RF signal splitting circuit portion.

2. A tap device for broadband communications systems as set forth in claim 1 in which, said intermediate circuit portion includes plug-in means for insertion into said receptacles to electrically connect said intermediate circuit portion between said RF signal coupling circuit portion first output receptacle and said RF signal splitting circuit portion input receptacle.

3. A tap device for broadband communications systems as set forth in claim 1 in which, said intermediate circuit portion consists of a plug-in short circuit feedthrough to electrically connect said RF signal coupling circuit portion first output with said RF signal splitting circuit portion input to provide that said second preselected degree of attenuation equals zero.

4. A tap device for broadband communications systems as set forth in claim 1 in which, said intermediate circuit portion includes a plug-in attenuator having a fixed attenuation value for further attenuating said RF signal coupling circuit portion attenuated RF output signal by said second preselected degree.

5. A tap device for broadband communications systems as set forth in claim 1 in which, said intermediate circuit portion includes a plug-in attenuator having an adjustable attenuation value for further attenuating said RF signal coupling circuit portion attenuated RF output signal by an adjustable second preselected degree.

6. A tap device for broadband communications systems as set forth in claim 1 in which, said second preselected degree of attenuation is within a range of between 0 decibels and 10 decibels.

7. A tap device for broadband communications systems as set forth in claim 1 in which, said intermediate circuit portion includes plug-in attenuators, and said plug-in attenuators provide said second preselected degree of attenuation within a range of between 1.0 decibels and 10 decibels.

8. A tap device for broadband communications systems as set forth in claim 7 in which, said plug-in attenuators provide said second preselected degree of attenuation in increments of 1.0 decibel.

9. A tap device for split-band single-cable communications systems comprising, an RF signal coupling circuit portion positioned on a circuit board, said RF signal coupling circuit portion having an input terminal and first and second output terminals, an RF signal splitting circuit portion positioned on said circuit board, said RF signal splitting circuit portion having an input terminal and a plurality of output terminals, said circuit board including a plurality of receptacles, said RF signal coupling circuit portion first output terminal being electrically connected to one of said receptacles and said RF signal splitting circuit portion input terminal being electrically connected to another of said receptacles, and an intermediate circuit portion removably connected between said RF signal coupling circuit portion first output terminal receptacle and said RF signal splitting circuit portion input terminal receptacle to electrically connect said intermediate circuit portion between said RF signal coupling circuit portion first output terminal and said RF signal splitting circuit portion input terminal, said intermediate circuit portion including filtering means for separating RF signals passing from said RF signal coupling circuit portion to said RF signal splitting circuit portion from RF signals passing from said RF signal splitting circuit portion to said RF signal coupling circuit portion, said intermediate circuit portion including receptacles for receiving plug-in attenuator means and electrically connecting said plug-in attenuator means with said filtering means for attenuating RF signals passing from said RF signal coupling circuit portion to said RF signal splitting circuit portion independently from RF signals passing from said RF signal splitting circuit portion to said RF signal coupling circuit portion.

10. A tap device for split-band single-cable communications systems as set forth in claim 9 in which,
said plug-in attenuator means includes a pair of individual plug-in attenuators each removably connected to said intermediate circuit portion receptacles.

11. A tap device for split-band single-cable communications systems as set forth in claim 9 in which,
said pair of individual plug-in attenuators operate independently from each other.

12. A tap device for split-band single-cable communications systems as set forth in claim 9 in which,
each of said plug-in attenuators has a preselected degree of attenuation.

13. A tap device for split-band single-cable communications systems as set forth in claim 12 in which,
said preselected degree of attenuation of each of said plug-in attenuators is within a range of between 0 decibels and 7 decibels.

14. A tap device for split-band single-cable communications systems as set forth in claim 12 in which,
each of said plug-in attenuators provides said preselected degree of attenuation in increments of 1 decibel.

15. A method for controlling the attenuation of a RF signal used in broadband communications systems comprising the steps of,
providing a circuit board including an RF signal coupling circuit portion and an RF signal splitting circuit portion positioned thereon, said RF signal coupling circuit portion including circuitry for sampling a portion of an RF signal delivered from a source and attenuating said sampled RF signal portion by a first preselected degree to provide an RF signal coupling circuit portion attenuated RF output signal,
providing said circuit board with a plurality of individual electroconductive receptacles,
connecting an output terminal of said RF signal coupling circuit portion having said RF signal coupling circuit portion attenuated RF output signal thereon to one of said circuit board receptacles,
connecting an input terminal of said RF signal splitting circuit portion to a different said circuit board receptacle,
inserting a removable intermediate circuit portion between said RF signal coupling circuit portion output terminal receptacle and said RF signal splitting circuit portion input terminal receptacle to electrically connect said intermediate circuit portion between said RF signal coupling circuit portion and said RF signal splitting circuit portion, and attenuating said RF signal coupling circuit portion attenuated RF output signal a second preselected degree by said intermediate circuit portion to control the total degree of attenuation of an RF signal supplied from said source to said RF signal splitting circuit portion.

16. A method for controlling the attenuation of an RF signal used in broadband communications systems as set forth in claim 15 which includes,
providing a plurality of intermediate circuit portions each having a different second preselected degree of attenuation.

17. A method for controlling the attenuation of an RF signal used in broadband communications systems as set forth in claim 15 which includes,
providing a plurality of intermediate circuit portions which have a second preselected degree of attenuation within a range of between 0 decibels and 10 decibels.

18. A method for controlling the attenuation of an RF signal used in broadband communications systems as set forth in claim 15 which includes,
providing a plurality of intermediate circuit portions having said preselected degree of attenuation in 1.0 decibel increments.

19. A method for controlling the attenuation RF signals used in split-band single-cable communications systems comprising the steps of,
providing a circuit board including an RF signal coupling circuit portion and an RF signal splitting circuit portion positioned thereon, said RF signal coupling circuit portion having at least one input terminal and one output terminal, said RF signal coupling circuit portion including circuitry for attenuating an RF signal passed through said RF signal coupling circuit portion from an input terminal to an output terminal, said circuitry also attenuating an RF signal passed from said output terminal to said input terminal,
providing said circuit board with a plurality of individual electroconductive receptacles,
connecting said output terminal of said RF signal coupling circuit portion to one of said circuit board receptacles,
connecting an input terminal of said RF signal splitting circuit portion to a different said circuit board receptacle,
inserting an intermediate circuit portion between said RF signal coupling circuit portion output terminal receptacle and said RF signal splitting circuit portion input terminal receptacle to electrically connect said intermediate circuit portion between said RF signal coupling circuit portion and said RF signal splitting circuit portion,
providing said intermediate circuit portion with filtering means for separating RF signals passing from said RF signal coupling circuit portion to said RF signal splitting circuit portion from RF signals passing from said RF signal splitting circuit portion to said RF signal coupling circuit portion, and
providing said intermediate circuit portion with intermediate circuit portion receptacles for receiving removable plug-in attenuator means and electrically connecting said plug-in attenuator means with said filtering means, said removable plug-in attenuator means attenuating RF signals passed from said RF signal coupling circuit portion to said RF signal splitting circuit portion independently from RF signals passed from said RF signal splitting circuit portion to said RF signal coupling circuit portion.

20. A method for controlling the attenuation of RF signals used in split-band single-cable communications systems as set forth in claim 19 which includes,
providing a pair of individual plug-in attenuators each removably connected to said intermediate circuit portion receptacles, one said plug-in attenuator attenuating RF signals passed from said RF signal coupling circuit portion to said RF signal splitting circuit portion, the other said plug-in attenuator attenuating RF signals passed from said RF signal splitting circuit portion to said RF signal coupling circuit portion.

21. A method for controlling the attenuation of RF signals used in split-band single-cable communications systems as set forth in claim 20 which includes,
providing that said pair of individual plug-in attenuators operate independently of each other.

22. A method for controlling the attenuation of RF signals used in split-band single-cable communications systems as set forth in claim 20 which includes,
providing that each of said plug-in attenuators has a preselected degree of attenuation.

23. A method for controlling the attenuation of RF signals used in split-band single-cable communications systems as set forth in claim 20 which includes,
providing said preselected degree of attenuation of each said plug-in attenuator within a range of between 0 decibels and 10.0 decibels.

24. A method for controlling the attenuation of RF signals used in split-band single-cable communications systems as set forth in claim 20 which includes,
providing said pair of plug-in attenuators having said preselected degree of attenuation in 1.0 decibel increments.

* * * * *